United States Patent [19]

Reher et al.

[11] Patent Number: 5,416,402
[45] Date of Patent: May 16, 1995

[54] STATE OF CHARGE INDICATOR FOR DEEP-CYCLE APPLICATION

[75] Inventors: Michael T. Reher, Grafton; Bradley N. Koeppel, Watertown, both of Wis.

[73] Assignee: Globe Union, Inc., Milwaukee, Wis.

[21] Appl. No.: 30,648

[22] Filed: Mar. 12, 1993

[51] Int. Cl.⁶ ............................................. G01N 27/20
[52] U.S. Cl. ..................................... 320/48; 320/43; 340/636; 324/433
[58] Field of Search .................... 320/48, 43; 340/636, 340/661, 660; 324/433, 431

[56] References Cited

U.S. PATENT DOCUMENTS

| | | | |
|---|---|---|---|
| 4,560,937 | 12/1985 | Finger | 324/433 |
| 4,740,754 | 4/1988 | Finger | 324/428 |
| 4,835,453 | 5/1989 | Munning Schmidt et al. | 320/13 |
| 5,130,699 | 7/1992 | Reher et al. | |
| 5,272,380 | 12/1993 | Clokie | 307/10.7 |
| 5,298,850 | 3/1994 | Matsui | 320/48 |

Primary Examiner—Steven L. Stephan
Assistant Examiner—Robert Nappi
Attorney, Agent, or Firm—Foley & Lardner

[57] ABSTRACT

A state of charge indicator monitors a voltage produced by a depletable energy source and provides an indication when the state of charge of the depletable energy source falls below a predetermined threshold. The state of charge indicator includes an input circuit for sensing the voltage and producing a plurality of tap voltages. The state of charge indicator further includes a monitor circuit for comparing each tap voltage with a corresponding threshold voltage and producing a result for each tap voltage falling below its corresponding threshold. The state of charge indicator still further includes a storage device for storing each result and producing an accumulated status and an output circuit for producing the indication when the accumulated status exceeds an accumulated status threshold.

8 Claims, 1 Drawing Sheet

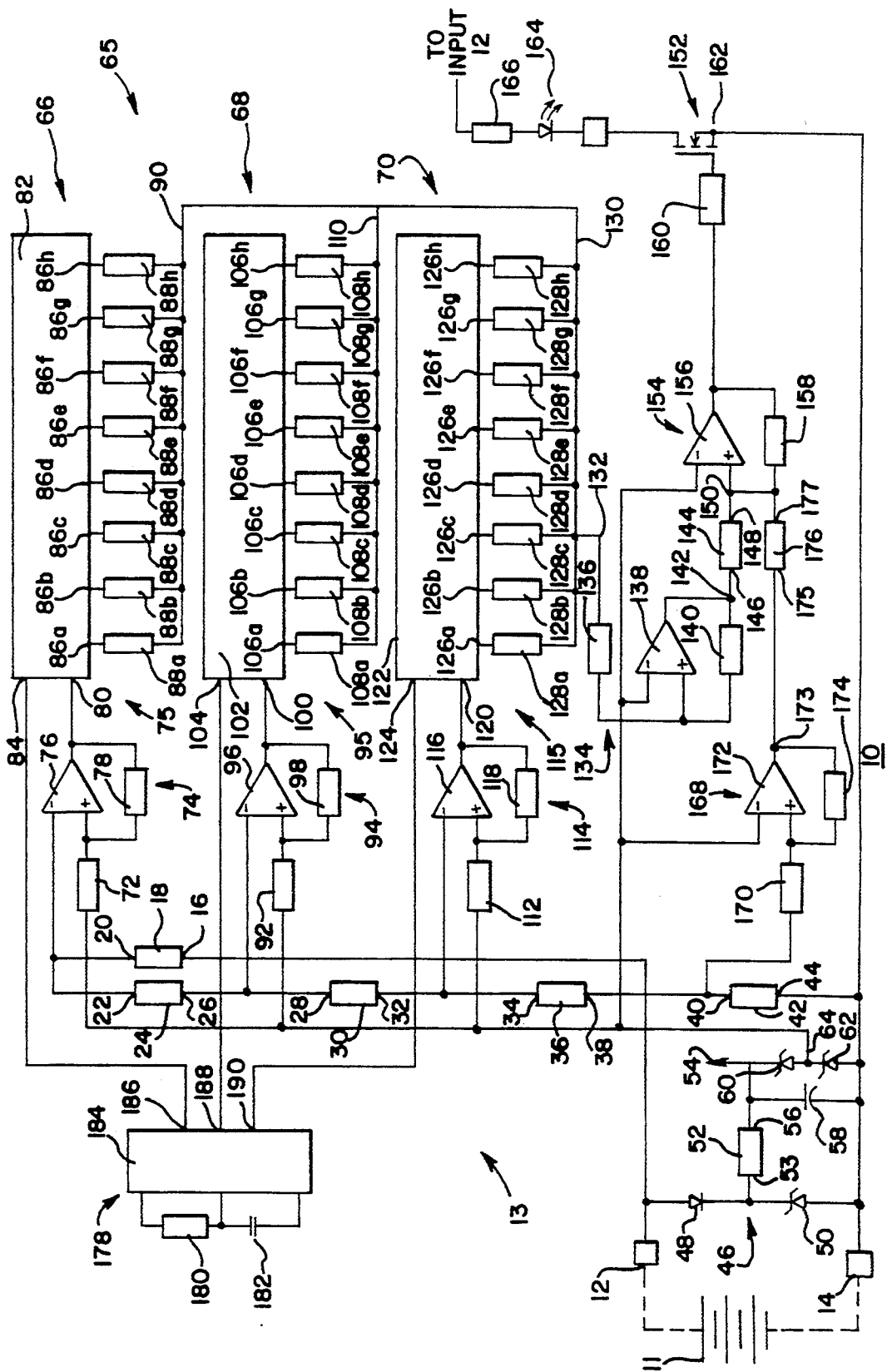

STATE OF CHARGE INDICATOR FOR DEEP-CYCLE APPLICATION

BACKGROUND OF THE INVENTION

The present invention generally relates to a state of charge indicator for providing an indication when the state of charge of a depletable energy source falls below a predetermined threshold. The present invention is more particularly directed to a state of charge indicator for monitoring a voltage produced by a battery used in a deep cycle application and producing an indication when the state of charge of the battery falls below a predetermined threshold.

The state of charge of a depletable energy source such as a battery is an indication of the relative amount of useable energy remaining in the battery. The state of charge is given as a percentage equal to the ratio of the present amount of useable energy remaining in the battery to the amount of useable energy in the battery when it is fully charged. Thus, a fully-charged battery has a 100% state of charge, a fully-discharged battery has a 0% state of charge, and a battery charged to a level equal to one-half its full state of charge has a 50% state of charge.

Batteries are often used in deep cycle applications to provide electrical energy to power electrical devices such as electric motors or emergency lighting. In deep cycle applications, batteries are routinely and repetitively discharged to a relatively low state of charge and recharged to a near-100% state of charge. In other applications, batteries such as starting batteries in automobiles, for example, are used only intermittently, to supply electrical energy to the starter motor of the automobile. Aside from these momentary intermittent usages, such batteries are generally maintained near 100% state of charge. Deep cycle applications, in contrast, routinely discharge the battery to a low state of charge during normal usage.

Typical deep cycle applications for a battery include providing power to an electric trolling motor in a fishing boat, providing power to the electric drive system of a battery-operated wheelchair, or emergency power for security systems. In such applications, the battery may be required to supply current for several hours. Supplying this current will discharge the battery to a relatively low state of charge. Later, the battery may be recharged to a nearly 100% state of charge. This same cycle of discharging and recharging the battery may be repeated many times over the life of the battery.

In view of these typical applications, it would be advantageous to provide a battery with a state of charge indicator. Such an indicator would provide a visible or audible indication when the state of charge of the battery has fallen below a predetermined threshold. The indication would inform a user of the low state of charge condition and the impending need to recharge the battery. The indication reduces the risk of discharging the battery to a level insufficient to provide usable power or to a level at which irreversible damage to the battery may occur.

Prior art state of charge indicators are not well-adapted to deep cycle battery applications. U.S. Pat. No. 5,130,699, issued to Reher, et al., on Jul. 14, 1992, and assigned to the assignee of the present invention, discloses a digital battery capacity warning device. The device periodically compares the output voltage produced by a battery with a predetermined threshold. The result of each comparison is stored. If three or more of the last 16 comparisons indicate a low voltage, an indication of low state of charge is provided. An indication is provided approximately 1.5 hours after the low state of charge condition occurred.

Such prior art state of charge indicators may not respond rapidly enough to the decreasing state of charge of a battery used in deep cycle applications. Because of the applications for deep cycle batteries noted above, including marine, wheelchair, and security applications, timely indication of a low state of charge condition is preferable. A 1.5 hour delay in providing a low state of charge indication could be intolerable in such applications.

Moreover, such prior art state of charge indicators are adapted to monitoring the state of charge when the battery is at rest and not subjected to a load current. For batteries utilized in deep cycle applications under normal operating conditions, the battery does not typically remain at rest for substantial periods. Rather, the battery may supply currents across a large range, such as 0 to 100 amperes. Accordingly, there is a need for a state of charge indicator for deep cycle applications which can provide a timely indication of a low state of charge condition when the battery is subjected to a wide range of load currents.

There is also a need for a low state of charge indicator which is not sensitive to voltage fluctuations which might cause the state of charge indication to fluctuate about the low state of charge set point. The state of charge indicator may provide, for example, an indication when the battery state of charge falls below a set point of 50% state of charge. As the state of charge of the battery falls below this set point, a transient in the current supplied by the battery may cause the voltage supplied by the battery to falsely indicate a state of charge above the set point. Accordingly, there is a need for a state of charge indicator which latches the low state of charge indication and does not reset the latched condition until the battery has been recharged to well above the state of charge setpoint level.

The state of charge indicator of the present invention provides solutions to these noted deficiencies in prior art state of charge indicators. In general, the state of charge indicator of the present invention measures battery voltage and compares the battery voltage to different preset voltage values at corresponding specified time intervals and evaluates if the battery voltage is above or below the preset voltage values. The preset voltage values and corresponding specified time intervals are empirically determined for a given type of battery and state of charge setpoint level. The results of the evaluations are placed into, for example, shift registers. The number of low indications within the shift registers are summed and evaluated. If the sum exceeds a predetermined accumulated status threshold, an output indication is provided, indicating a low state of charge condition. If the low state of charge indication is provided, this output indication is latched until the state of charge indicator detects that the battery has been recharged to well above the predetermined state of charge setpoint level.

SUMMARY OF THE INVENTION

The present invention provides a state of charge indicator for monitoring the voltage of a depletable energy source and providing an indication when the state of charge of the depletable energy source falls below a predetermined threshold level. The state of charge indicator includes an input means for sensing the voltage of the depletable energy source and providing a signal to a monitor means comprising several stages. Each stage of the monitor means compares the sensed voltage signal to the corresponding threshold voltage for that stage. Each stage further comprises a storage means for storing the result of the comparison at regular time intervals for that stage. The storage means stores a finite number of results representing the short term history of comparisons for that stage. The state of charge indicator further includes an output means coupled to the storage means of all individual stages. The stored results of all the stages are summed to produce an accumulated status. The output means produces the indication when the accumulated status exceeds the accumulated status threshold. The state of charge indicator further provides a recharge monitor means coupled to the input means for determining if the depletable power source has been recharged. The output means continues to produce the indication until the accumulated status no longer exceeds the accumulated status threshold and the recharge monitor means indicates that the depletable energy source has been recharged.

The present invention provides a state of charge indicator for monitoring a voltage produced by a depletable energy source and providing an indication when the state of charge of the depletable energy source falls below a predetermined threshold. The state of charge indicator includes input means for sensing the voltage and producing a plurality of tap voltages and monitor means coupled to the input means for comparing each tap voltage with a corresponding threshold voltage and producing a result for each tap voltage falling below its corresponding threshold voltage. The state of charge indicator still further includes storage means for storing each result at corresponding time intervals and producing an accumulated status and output means coupled to the storage means for producing the indication in response to the accumulated status exceeding an accumulated status threshold.

In accordance with the present invention, the input means of the state of charge indicator may further produce a recharge tap voltage. The state of charge indicator of the present invention may further comprise recharge monitor means for forcing the output means to continue providing the indication when the accumulated status no longer exceeds the accumulated status threshold and when the recharge tap voltage remains below a recharge threshold.

The present invention further provides a state of charge indicator for providing an indication when the state of charge of a battery falls below a predetermined threshold level. The state of charge indicator includes input means for sensing a voltage produced by the battery and producing a plurality of tap voltages and a plurality of monitor stages coupled to the input means and having a common output. Each monitor stage includes sensing means for sensing one tap voltage of the plurality of tap voltages and producing a result when the one tap voltage falls below a predetermined threshold. Each monitor stage further includes storage means coupled to the sensing means for storing each result at corresponding time intervals, the storage means having an output coupled to the common output for supplying an accumulated status. The state of charge indicator further includes comparator means coupled to the common output for producing a signal when the accumulated status exceeds a predetermined accumulated status threshold and output means coupled to the comparator means for providing the indication in response to the signal.

The present invention still further provides a method of monitoring a voltage produced by a depletable energy source and producing an indication when the state of charge of the depletable energy source falls below a predetermined threshold. The method includes the steps of sensing the voltage and producing a plurality of tap voltages, comparing each tap voltage to a corresponding threshold voltage and producing a result for each tap voltage falling below its corresponding threshold voltage, producing an accumulated status of the results, and providing the indication when the accumulated status exceeds an accumulated status threshold.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawing, in the sole FIGURE of which identical reference characters indicate identical elements, and wherein the sole FIGURE is a schematic diagram illustrating the manner in which the present invention may be implemented in hardware form in accordance with the preferred embodiment of the present invention.

DESCRIPTION OF THE PREFERRED EMBODIMENT

Referring now to the sole FIGURE, it illustrates a state of charge indicator 10 embodying the present invention. The state of charge indicator 10 is of the type which monitors a voltage produced by a depletable energy source such as a battery 11 and provides an indication when the state of charge of the depletable energy source falls below a predetermined threshold.

The state of charge indicator 10 generally includes input means 13, a threshold generating means 46, monitor means 65, comparator means 134 and output means 152. The monitor means 65 may include one or more monitor stages such as first monitor stage 66, second monitor stage 68 and third monitor stage 70. The state of charge indicator 10 also includes recharge monitor means 168 and clock means 178.

The input means 13 of the state of charge indicator 10 includes a positive input 12, a negative input 14, and resistors 18, 24, 30, 36, and 42. The positive input 12 and the negative input 14 are preferably coupled to the terminals of the depletable energy source 11. The negative input 14 preferably forms or provides system ground. The positive input 12 is coupled to the first end 16 of resistor 18. The second end 20 of the resistor 18 is coupled to the first end 22 of resistor 24. The second end 26 of the resistor 24 is coupled to the first end 28 of resistor 30. The second end 32 of the resistor 30 is coupled to the first end 34 of resistor 36. The second end 38 of the resistor 36 is coupled to the first end 40 of resistor 42. The second end 44 of resistor 42 is coupled to the negative input 14. Resistor 18, resistor 24, resistor 30, resistor 36, and resistor 42 form input means 13 for sensing the voltage between the positive input 12 and the negative input 14 and producing a plurality of tap voltages.

Also coupled to the positive input 12 is the threshold generating means 46. The threshold generating means 46 includes a diode 48, a resistor 52, zener diodes 50, 60 and 62, and capacitor 58. The anode of the diode 48 is coupled to the positive input 12. The cathode of the diode 48 is coupled to the cathode of the zener diode 50 and a first end 53 of the resistor 52. The anode of the zener diode 50 is coupled to the negative input 14. The second end 56 of the resistor 52 is coupled to a VCC node 54. The VCC node 54 is preferably provided with a voltage of +5 volts and provides positive supply voltage to other components of the state of charge indicator 10. The capacitor 58 is coupled between the second end 56 of the resistor 52 and the negative input 14. The cathode of the zener diode 60 is coupled to the second end 56 of the resistor 52. The anode of the zener diode 60 is coupled to a reference node 64. The cathode of the zener diode 62 is coupled to the reference node 64. The anode of the zener diode 62 is coupled to the negative input 14.

In the operation of the threshold generating means 46, a reference voltage is provided at the reference node 64. This reference voltage is preferably temperature and current compensated as is well-known in the art. This reference voltage is used for producing threshold voltages corresponding to each tap voltage produced by the input means 13.

The reference node 64 is coupled to monitor means 65. The monitor means 65 includes first, second and third monitor stages 66, 68 and 70.

The first monitor stage 66 includes monitor means 74 and storage means 75. The storage means 75 includes shift register 82 and resistors 88a, 88b, 88c, 88d, 88e, 88f, 88g, and 88h. In the first monitor stage 66, a resistor 72 is coupled between the reference node 64 and the monitor means 74. The monitor means 74 includes an operational amplifier 76 and a feedback resistor 78. The output of the monitor means 74 is coupled to an input 80 of shift register 82. The shift register 82 also has a clock input 84. The shift register 82 further has outputs 86a, 86b, 86c, 86d, 86e, 86f, 86g, and 86h coupled to resistors 88a, 88b, 88c, 88d, 88e, 88f, 88g, and 88h, respectively, which have a common connection to form an output 90 of the first monitor stage 66.

The second monitor stage 68 includes monitor means 94 and storage means 95. The storage means 95 includes shift register 102 and resistors 108a, 108b, 108c, 108d, 108e, 108f, 108g, and 108h. In the second monitor stage 68, a resistor 92 is coupled between the reference node 64 and the monitor means 94. The monitor means 94 includes an operational amplifier 96 and a feedback resistor 98. The output of the monitor means 94 is coupled to an input 100 of the shift register 102. The shift register 102 also has a clock input 104. The shift register 102 has outputs 106a, 106b, 106c, 106d, 106e, 106f, 106g, and 106h coupled to resistors 108a, 108b, 108c, 108d, 108e, 108f, 108g, and 108h, respectively, which have a common connection to form an output 110 of the second monitor stage 68.

The third monitor stage 70 includes monitor means 114 and storage means 115. The storage means 115 includes shift register 122 and resistors 128a, 128b, 128c, 128d, 128e, 128f, 128g, and 128h. In the third monitor stage 70, a resistor 112 is coupled between the reference node 64 and the monitor means 114. The monitor means 114 includes an operational amplifier 116 and a feedback resistor 118. The output of the monitor means 114 is coupled to an input 120 of a shift register 122. The shift register 122 also has a clock input 124. The shift register 122 has outputs 126a, 126b, 126c, 126d, 126e, 126f, 126g, and 126h coupled to resistors 128a, 128b, 128c, 128d, 128e, 128f, 128g, and 128h, respectively, which have a common connection to form an output 130 of the third monitor stage 70.

The output 90 of the first monitor stage 66, the output 110 of the second monitor stage 68 and the output 130 of the third monitor stage 70 are coupled together to form a common output 132. The common output 132 is coupled to the comparator means 134. The comparator means 134 includes a resistor 136, an operational amplifier 138, a feedback resistor 140 and a resistor 144. The inverting input of the operational amplifier 138 is coupled to the reference node 64. The operational amplifier 138 has an output 142 coupled to a first end 146 of the resistor 144. The second end 148 of the resistor 144 is coupled to node 150.

Node 150 is also coupled to the output means 152. The output means 152 includes a latch means 154 and an output device 162. The latch means 154 includes an operational amplifier 156 and a feedback resistor 158. The output of the latch means 154 is coupled to a resistor 160. The resistor 160 is further coupled to the output device 162 which may be a switching device such as a field effect transistor. In the embodiment shown in the FIGURE, the output means 162 is coupled to a light emitting diode 164. The anode of the light emitting diode 164 is coupled to a current limiting resistor 166. The resistor 166 is coupled to the positive input 12. Thus, when the output means 152 provides an indication of low state of charge, light emitting diode 164 is illuminated. The low state of charge indication may be any visual, electrical, audible, or other signal capable of indicating the low state of charge condition to the user.

The state of charge indicator 10 also includes recharge monitor means 168. The first end 40 resistor 42 of the input means 13 is also coupled to the recharge monitor means 168. The recharge monitor means 168 includes a resistor 170, an operational amplifier 172, a feedback resistor 174 and a resistor 176. The inverting input of the operational amplifier 172 is coupled to the reference node 64. The recharge monitor means 168 has an output 173 coupled to a first end 175 of the resistor 176. The second end 177 of the resistor 176 is coupled to node 150.

Lastly, the state of charge indicator 10 includes a clock means 178 for providing a plurality of clock signals. Clock means 178 includes a resistor 180, a capacitor 182 and a clock generator 184. The clock generator 184 provides clock signals on outputs 186, 188, and 190. Output 186 is coupled to the clock input 84 of the shift register 82. Output 188 is coupled to the clock input 104 of the shift register 102. Output 190 is coupled to the clock input 124 of the shift register 122. The clock generator 184 generates clock signals at a rate determined by the values of resistor 180 and capacitor 182. Preferably, the frequencies of clock signals provided on outputs 186, 188 and 190 are different. Preferably the frequency of the clock signal provided on output 190 is lower than the frequency of the clock signal provided on output 188. Also, preferably the frequency of the clock signal provided on output 188 is lower than the frequency of the clock signal provided on output 186.

For monitoring a voltage produced by a depletable energy source and providing an indication when the state of charge of the depletable energy source falls below a predetermined threshold, positive input 12 and negative input 14 are coupled to the output terminals of the depletable energy source. The resistors 18, 24, 30, 36, and 42 form a voltage divider. The voltage divider produces tap voltages proportional to the voltage between positive input 12 and negative input 14. A first tap voltage is produced at the second end 20 of the resistor 18 and supplied to the inverting input of the operational amplifier 76 of the monitor means 74 of the first monitor stage 66. The monitor means 74 forms a comparator with hysteresis, well-known in the art. The magnitude of the tap voltage supplied to the inverting input of the operational amplifier 76 is compared with a threshold voltage at the noninverting input of operational amplifier 76. When the tap voltage supplied to monitor means 74 is greater than the threshold voltage supplied to the monitor means 74, the output of the monitor means 74 will be a voltage corresponding to a logical 0 value. When the tap voltage supplied to the monitor means 74 is less than the threshold voltage supplied to the monitor means 74, as when the state of charge of the depletable energy source coupled to positive input 12 and negative input 14 is diminished in value, the output of the monitor means 74 will be a voltage corresponding to a logical 1 value.

The output produced by the monitor means 74 is supplied to the input 80 of the shift register 82. The shift register 82 preferably includes a plurality of storage locations, each storage location having an associated order, the order being from highest to lowest. In response to a clock signal received at clock input 84, the shift register 82 discards the contents of the highest-ordered storage location, sequentially moves the contents of each storage location to the next highest-ordered storage location, and stores the logical value supplied at input 80 in the lowest ordered storage location. Preferably, shift register 82 includes eight such storage locations. The contents of each such storage location is supplied to outputs 86a, 86b, 86c, 86d, 86e, 86f, 86g, and 86h, respectively. A voltage corresponding to the sum of the contents of the eight storage locations of the shift register 82 is supplied to output 90 of first monitor stage 66.

Thus, the first monitor stage 66 compares the tap voltage at the second end 20 of the resistor 18 with a corresponding threshold voltage and produces a result. Responsive to clock signals from the clock means 178, the first monitor stage 66 stores the results of the eight preceding comparisons. The results of these comparisons are summed and a voltage corresponding to the sum is provided at the output 90.

In a similar manner, the second monitor stage 68 compares the tap voltage at the second end 26 of the resistor 24 with a corresponding threshold voltage and produces a result. Responsive to clock signals from the clock means 178, the second monitor stage 68 stores the results of the eight preceding comparisons. The results of these comparisons are summed and a voltage corresponding to the sum is provided to the output 110.

In like manner, the third monitor stage 70 compares the tap voltage at the second end 32 of the resistor 30 with a corresponding threshold voltage and produces a result. Responsive to clock signals from the clock means 178, the third monitor stage 70 stores the results of the eight preceding comparisons. The results of these comparisons are summed and a voltage corresponding to the sum is provided to the output 130.

As noted above, the clock signals provided at the outputs 186, 188 and 190 of the clock means 178 to the first monitor stage 66, the second monitor stage 68, and the third monitor stage 70, respectively, preferably have differing frequencies. Preferably, the clock signal provided to the first monitor stage 66 has a greater frequency than the clock signal provided to the second monitor stage 68 and the clock signal provided to the second monitor stage 68 has a greater frequency than the clock signal provided to the third monitor stage 70. Thus, the first monitor stage 66, which compares the tap voltage having the highest voltage magnitude which corresponds to the threshold voltage having the lowest voltage magnitude, stores the results of the comparisons most frequently. Similarly, the third monitor stage 70, which compares the tap voltage having the lowest voltage magnitude which corresponds to the threshold voltage having the highest voltage magnitude, stores the results of the comparison least frequently.

During the discharge cycle of a battery, the battery voltage decreases as the battery state of charge decreases for a given discharge rate. Similarly, the voltage decreases as the rate of discharge increases for a given state of charge condition. Each stage compares the battery voltage to different threshold voltages at different rates. A relatively low battery voltage can be attributed to two conditions: the rate of discharge is high or the battery state of charge is low. Both of these conditions necessitate that the sampling rate for the stage with the lower threshold voltage be relatively fast in order that the battery monitor indicates before the battery state of charge falls well below the predetermined state of charge threshold. Conversely, a relatively high battery voltage indicates that the battery state of charge is high or that the discharge rate is low. These two conditions necessitate that the sample rate for the stage with the higher threshold voltage be relatively slow. In this second scenario, there is plenty of time to identify the low state of charge condition before the battery state of charge falls below the predetermined state of charge threshold. Through proper selection of threshold voltages and storage rates, a given state of charge can be correctly identified for varying discharge conditions to a high level of precision.

The embodiment of the present invention shown in the drawing includes three monitor stages, the first monitor stage 66, the second monitor stage 68, and the third monitor stage 70. As will be appreciated by those skilled in the art, a different number of monitor stages may be utilized without departing from the present invention. The number of stages required is dependent upon the application for which the battery coupled to the state of charge indicator 10 is used. More monitor stages will be required in applications which have a broad current range, i.e., a current range from 0 to 150 amperes during use or in applications in which the current supplied by the battery varies greatly, i.e., the current fluctuates during use from 0 to 75 to 25 to 100 amperes. Also, the state of charge indicator will require more stages for applications in which it is desirable to increase the accuracy of the state of charge indicator.

The clock frequencies supplied by the clock means 178 and the predetermined threshold voltages corresponding to each tap voltage are chosen based on known characteristics of the battery to which the state of charge indicator 10 is coupled. The frequencies and threshold voltages are also preferably chosen so that state of charge indicator 10 will provide the state of charge indication at any predetermined level from 0% to 100% state of charge and to some level of precision, such as a 5% band about the predetermined state of charge level.

The monitor means 134 monitors the accumulated status produced at the common output 132 of the first monitor stage 66, the second monitor stage 68 and the third monitor stage 70. The accumulated status is supplied to the noninverting input of the operational amplifier 138. The reference voltage on the reference node 64 is supplied to the inverting input of the operational amplifier 138. When the voltage magnitude of the accumulated status is less than the voltage magnitude of the reference voltage at node 64, the output of the operational amplifier 138 corresponds to a logical 0 value. This logical 0 value indicates that the state of charge indicator has not detected a low state of charge condition. When the voltage magnitude of the accumulated status is greater than the reference voltage, the output of the operational amplifier 138 will have a value corresponding to a logical 1 value. This logical 1 value indicates that the state of charge indicator 10 has detected a low state of charge indication.

The recharge monitor means 168 monitors a recharge tap voltage produced at the second end 38 of the resistor 36. The recharge tap voltage is supplied to the noninverting input of the operational amplifier 172. The reference voltage is supplied on the reference node 64 to the inverting input of operational amplifier 172. When the recharge tap voltage has a voltage magnitude greater than the reference voltage supplied on the reference node 64 the output of the operational amplifier 172 has a logical 1 value. When the recharge tap voltage has a voltage magnitude less than the reference voltage, the output of the operational amplifier 172 has a logical 0 value. The logical 1 value at the output of the operational amplifier 172 indicates that the depletable energy source coupled across the positive input 12 and the negative input 14 is charging or is fully charged. The logical 0 value at the output of the operational amplifier 172 indicates that the depletable energy source is not charging or is not fully charged. The recharge monitor means 168 is used for forcing the output means 162 to continue providing a low state of charge indication when the accumulated status no longer exceeds the accumulated status threshold and when the recharge tap voltage falls below the recharge threshold. Thus, the output of the operational amplifier 172 provides a recharge signal.

An important aspect of the present invention is provided by the latch means 154. The latch means 154 forms an output control means for controlling the output means 162 in response to the comparator means 134 and the recharge monitor means 168. The operation of the latch means 154 is shown in the truth table, Table I.

| Previous Output (156) | Charging (172) | Accumulated Status (138) | Next Output (156) |
|---|---|---|---|
| 0 | 0 | 0 | 0 |
| 0 | 0 | 1 | 1 |
| 0 | 1 | 0 | 0 |
| 0 | 1 | 1 | 1 |
| 1 | 0 | 0 | 1 |
| 1 | 0 | 1 | 1 |
| 1 | 1 | 0 | 0 |
| 1 | 1 | 1 | 1 |

As will be noted from Table I, the next output, the output of the operational amplifier 156, is a function of the previous output, which is the output of the operational amplifier 156, the recharge signal, which is the output of the operational amplifier 172, and the accumulated status which is the output of the operational amplifier 138. When the next output has a logical 0 value, the output means 162 will not provide a low state of charge indication. Similarly, when the next output has a logical value 1, the output means 162 will provide a low state of charge indication.

As can thus be seen in Table I, the state of the next output generally tracks the state of the accumulated status. However, where the accumulated status is a 0, indicating the battery does not presently have a low state of charge, and the charging output is a 0, indicating the battery is not recharging or fully charged, and the previous output was a 1, indicating a low state of charge, the next output remains a logical 1, indicating low state of charge. Thus, the state of charge indicator 10 is rendered insensitive to short-term fluctuations of the output voltage of the depletable energy source. Once the state of charge indicator 10 has detected a low state of charge and provided an indication through the output means 162, the low state of charge state is latched by the latch means 154. The latch means 154 is only reset by a logical 1 on the charging output, the output of the operational amplifier 172.

From the foregoing, it can be seen that the present invention provides a new and improved state of charge indicator for monitoring a voltage produced by a depletable energy source and providing an indication when the state of charge of the depletable energy source falls below a predetermined threshold. In addition, the state of charge indicator of the present invention assures that the low state of charge indication will continue to be provided until the depletable energy source has been recharged to well above the predetermined setpoint level.

While a particular embodiment of the present invention has been shown and described, modifications may be made, and it is therefore intended in the appended claims to cover all such changes and modifications which fall within the true spirit and scope of the invention.

What is claimed is:

1. A state of charge indicator for monitoring a voltage produced by a depletable energy source and providing an indication when the state of charge of the depletable energy source falls below a predetermined threshold, said state of charge indicator comprising:

input means for sensing said voltage and producing a plurality of tap voltages and a recharge tap voltage;

monitor means coupled to said input means for comparing each respective tap voltage with a corresponding threshold voltage and producing a result for said each respective tap voltage falling below its corresponding threshold voltage;

clock means for providing a plurality of clock signals including a clock signal;

storage means for storing each said result and producing an accumulated status, said storage means including a shift register corresponding to each said tap voltage for storing said result and wherein each said shift register is responsive to a different clock signal of said plurality of clock signals, each said shift register including a plurality of storage locations, each said storage location having an associated order, said order being from highest to lowest, and wherein said storage means is responsive to said clock signal for discarding the contents of the highest ordered storage location, sequentially moving the contents of each storage location to the next-highest-ordered storage location, and storing said result in the lowest-ordered storage location;

recharge monitor means coupled to said input means for sensing said recharge tap voltage and producing a recharge signal when said depletable energy source is not charging and said depletable energy source is not fully charged; and output means coupled to said storage means for producing the indication when said accumulated status exceeds an accumulated status threshold and when said accumulated status does not exceed said accumulated status threshold and said recharge monitor means produces said recharge signal.

2. A state of charge indicator for providing an indication when the state of charge of a battery falls below a predetermined threshold level, said state of charge indicator comprising:

input means for sensing a voltage produced by said battery and producing a plurality of tap voltages;

a plurality of monitor stages coupled to said input means and having a common output, each monitor stage of said plurality of monitor stages including monitor means for sensing one tap voltage of said plurality of tap voltages and producing a result when said one tap voltage falls below a predetermined threshold and storage means coupled to said monitor means for storing each said result, said storage means having an output coupled to said common output for supplying an accumulated status;

comparator means coupled to said common output for producing an accumulated status signal when said accumulated status exceeds a predetermined accumulated status threshold;

recharge monitor means coupled to said input means for monitoring one tap voltage of said plurality of tap voltages, said recharge monitor means including recharge comparator means for generating a recharge signal when said one tap voltage does not exceed a recharge threshold;

output means coupled to said comparator means for providing said indication in response to said accumulated status signal; and output control means having an input coupled to said comparator means for receiving said accumulated status signal and coupled to said recharge monitor means for receiving said recharge signal, said output control means having an output coupled to said output means for conveying said accumulated status signal to said output means and for forcing said output means to continue providing said indication when said comparator means no longer produces said accumulated status signal and said recharge monitor means generates said recharge signal.

3. A state of charge indicator as defined in claim 2 wherein said storage means includes a plurality of storage locations for storing a like plurality of said results, each storage location of said plurality of storage locations having an associated order, said order being from highest to lowest, and wherein said storage means is responsive to a clock signal for discarding the contents of the highest ordered of said storage locations, sequentially moving the contents of each storage location of said plurality of storage locations to the next highest ordered storage location and storing said result in the lowest ordered of said storage locations, each storage location of said plurality of storage locations being coupled to said common output.

4. A state of charge indicator as defined in claim 3 wherein said storage means includes a shift register.

5. A state of charge indicator as defined in claim 3 wherein each storage means of said plurality of monitor stages is coupled to a different clock signal of a plurality of clock signals.

6. A state of charge indicator as defined in claim 5 further comprising clock means for generating said plurality of clock signals.

7. A state of charge indicator as defined in claim 2 wherein each monitor means of said plurality of monitor stages is coupled to a different predetermined threshold of a plurality of predetermined thresholds.

8. A state of charge indicator as defined in claim 7 further comprising threshold generating means for generating said plurality of predetermined thresholds.

* * * * *